United States Patent
Moden et al.

(10) Patent No.: US 6,974,725 B2
(45) Date of Patent: Dec. 13, 2005

(54) INTERCONNECTIONS FOR A SEMICONDUCTOR DEVICE

(75) Inventors: Walter L. Moden, Boise, ID (US); Larry D. Kinsman, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/808,713

(22) Filed: Mar. 23, 2004

(65) Prior Publication Data

US 2004/0178512 A1 Sep. 16, 2004

Related U.S. Application Data

(62) Division of application No. 10/015,337, filed on Dec. 11, 2001, now Pat. No. 6,709,893, which is a division of application No. 09/076,334, filed on May 11, 1998, now Pat. No. 6,329,709.

(51) Int. Cl.[7] .............................................. H01L 21/44
(52) U.S. Cl. ....................... 438/113; 438/114; 438/460; 438/462
(58) Field of Search .................................. 438/112, 113, 438/114, 460, 461, 462, 463, 464, 465

(56) References Cited

U.S. PATENT DOCUMENTS

| | | | |
|---|---|---|---|
| 4,515,480 A | 5/1985 | Miller et al. ................. | 356/400 |
| 5,107,325 A | 4/1992 | Nakayoshi ................... | 257/793 |
| 5,134,462 A | 7/1992 | Freyman et al. ............. | 257/688 |
| 5,360,992 A | 11/1994 | Lowrey et al. ............. | 257/666 |
| 5,593,927 A | 1/1997 | Farnworth et al. .......... | 438/113 |
| 5,710,062 A | 1/1998 | Sawai et al. ................. | 438/127 |
| 5,824,569 A | 10/1998 | Brooks et al. ............... | 438/127 |
| 5,856,212 A | 1/1999 | Chun .......................... | 438/126 |
| 5,950,072 A | 9/1999 | Queyssac .................... | 438/118 |
| 6,083,838 A | 7/2000 | Burton et al. ............... | 438/691 |
| 6,207,477 B1 * | 3/2001 | Motooka et al. ............ | 438/113 |
| 6,329,709 B1 | 12/2001 | Moden et al. .............. | 257/690 |
| 6,759,311 B2 * | 7/2004 | Eldridge et al. ............ | 438/460 |

FOREIGN PATENT DOCUMENTS

JP     9-134982     5/1997     ........... H01L/23/28

* cited by examiner

Primary Examiner—Kevin M. Picardat
(74) Attorney, Agent, or Firm—Kevin D. Martin

(57) ABSTRACT

A method for forming an electrical contact for a semiconductor device comprises the steps of providing a semiconductor wafer section having a major surface with a plurality of conductive pads thereon and electrically coupling each pad with an elongated electrical interconnect. Next, each electrical interconnect is encased in a dielectric and the dielectric is sectioned to expose a portion of each interconnect. An inventive structure which can be formed by the inventive method is also described.

21 Claims, 2 Drawing Sheets

INTERCONNECTIONS FOR A SEMICONDUCTOR DEVICE

This is a division of U.S. Ser. No. 10/015,337 filed Dec. 11, 2001 and issued Mar. 23, 2004 as U.S. Pat. No. 6,709, 893, which was a division of U.S. Ser. No. 09/076,334 filed May 11, 1998 and issued Dec. 11, 2001 as U.S. Pat. No. 6,329,709.

FIELD OF THE INVENTION

This invention relates to the field of semiconductor assembly, and more particularly to an interconnection method and structure for a semiconductor device.

BACKGROUND OF THE INVENTION

A semiconductor device in its most common form comprises a semiconductor die having bond pads thereon, a lead frame mechanically connected with the die, bond wires which electrically couple the bond pads with lead fingers of the lead frame, and encapsulation material which surrounds the die, the bond wires, and the majority of the lead frame. The device is electrically coupled with a printed circuit board (PCB) by soldering leads of the lead frame with pads on the PCB.

While increasing the speed and improving the reliability of components such as microprocessors, memory, and logic devices are goals of designers, the design described above has elements that are contrary to optimal component speed and reliability. For example, each bond wire is connected at two points, one connection to a bond pad and one connection to a lead finger of the lead frame. These connections are subject to separation, for example from pressure exerted on the bond wire during the encapsulation process resulting from lead sweep. Further, the connection may be adequate during testing but the bond wire can separate from the die or the lead frame during shipment or while in use from various failure mechanisms. Finally, the signal path provided by conventional package designs is relatively long which decreases signal speed and integrity and thereby increases the signal delay.

Another source of malfunction for semiconductor devices is the mechanical attachment between the die and the lead frame. The die rests on a die paddle in a typical package or is attached to lead fingers overlying the die in a leads-over-chip package. In either case separation of the die from the lead frame can occur, for example from thermal mismatch between the silicon die and the metal lead frame which stresses an attachment material that mechanically connects the die with the lead frame.

Another disadvantage of the design described above is that while it can be manufactured to produce a relatively thin package, for example in a thin small outline package (TSOP), an encapsulated semiconductor device requires a relatively large surface area of the PCB onto which it is installed. As miniaturization of electronics is typically a design goal, the semiconductor device described above does not lend itself to providing a small assembly.

A method and structure for providing an interconnection for communication with a semiconductor device which reduces or eliminates the problems described above would be desirable.

SUMMARY OF THE INVENTION

The present invention provides a new method and structure which reduce problems associated with the manufacture of semiconductor devices, particularly problems resulting from poor bond wire connections and problems associated with lead frames. In accordance with one embodiment of the invention, a semiconductor device is provided which comprises a semiconductor wafer section (which can include an entire wafer or a portion thereof) having a major surface with a plurality of conductive pads thereon and a plurality of elongated electrical interconnections having first and second ends. The first end of each interconnection is formed to contact one of the pads. The device further comprises a dielectric encasing the electrical interconnections wherein at least a portion of the major surface is encased in dielectric. The second end of each the electrical interconnection is free from dielectric.

The end which is free from dielectric provides a contact point for attachment to an electronic device, for example through a printed circuit board. Thus the lead frame is eliminated and the interconnection which contacts the bond pad can be directly electrically coupled with the printed circuit board.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
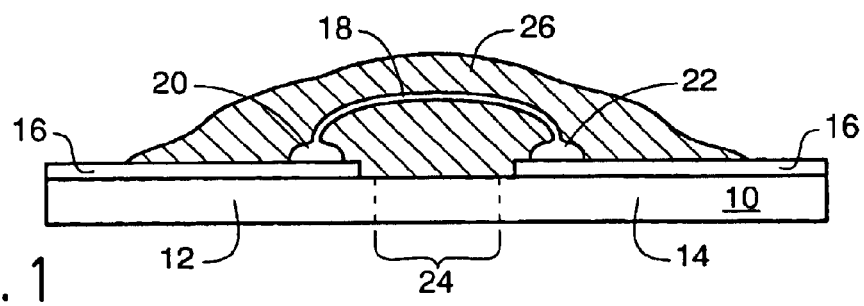
FIG. 1 is a cross section depicting an in-process structure comprising a wafer section having an interconnect encased in dielectric.

A first step of an inventive method for forming an electrical contact for a semiconductor device comprises the structure of FIG. 1 which depicts an in-process semiconductor wafer section (which can include a entire wafer or a portion thereof) 10 with at least a first 12 and a second 14 unsingularized semiconductor die. In other embodiments a single singularized semiconductor die could be used in place of the wafer section depicted. In the FIG. 1 embodiment the first and second die comprise a plurality of conductive pads 16 on a major surface of each die. Each element 16 as depicted includes a conductive line which attaches to other locations on the die. Only one pad is depicted on each die in FIG. 1 although each die will likely comprise a plurality of pads.

Next, each pad 16 is electrically coupled with an elongated electrical interconnect such as the bond wire 18 depicted, tape automated bonds, or other workable interconnection structures. In FIG. 1, one end 20 of bond wire 18 is attached to a bond pad 16 on the first die 12, and the other end 22 is attached to a bond pad 16 of the second die 14. Thus the bond wire 18 spans or bridges a saw kerf 24 or "street" area between the two adjacent unsingularized die 12, 14. Wire bonding can include the ball bonds depicted, wedge bonds, or other workable connection methods. As an exemplary embodiment, the bond wire can be a conventional gold-aluminum alloy wire 1.0 mil to 1.2 mils in diameter, or it can be enlarged to about 2.0 mils to 4.0 mils to allow for an increased contact surface area. A bond wire from about 10 to 20 mils in length would allow for a controllable loop height.

The electrical interconnect 18 is then encased in a dielectric material 26 such as polyimide, "glob top" material such as a liquid epoxy encapsulant, a room-temperature vulcanizing (RTV) rubber, a photoimagable polymer such as benzocyclobutene (BCB), a silicone gel, or other workable materials. Ideal properties of the dielectric used for this embodiment include a material which is electrically nonconductive, thermally conductive, noncorrosive, which has a thermal coefficient of expansion compatible with silicon, and which adheres well to the interconnect and to the wafer section. The dielectric 26 can cover only the interconnect 18 and the area of the wafer section immediately surrounding the interconnect as depicted in FIG. 1, or the dielectric can be formed over the entire surface of the wafer section or over a portion of the wafer section. To form the dielectric 26 only on the interconnect 18 and surrounding area or over only a portion of the wafer section, possible means of dispensing the dielectric include screen printing, syringe dispensing, stenciling, and thick spin coating. To form the dielectric over the entire surface of the wafer section, a fence can be formed around the perimeter of the wafer section such as is done during conventional glob top manufacturing to contain the dispensed dielectric. Alternately, a spun-on coat of dielectric such as spun-on glass can be formed, or a meniscus thick film coat of polymeric epoxy resin such as EPON® Resin SU-8 available from Shell Chemical Co. of Houston, Tex. can be used. The dielectric can thus serve a second use as a passivation layer for the remaining circuitry on the surface of the wafer section. To minimize the thickness of the device and to reduce temperature problems the dielectric should be just thick enough to cover and adequately protect the interconnect. Using a structure having a bond wire height of 4 mils, a dielectric thickness of about 6 mils would be sufficient.

Figure 2:
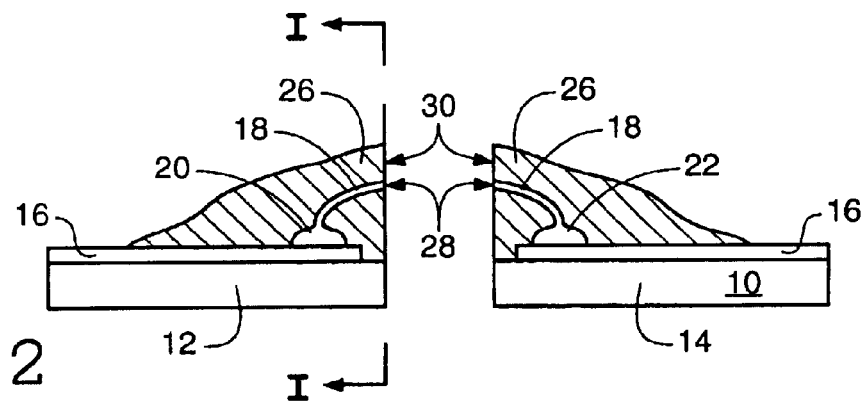
FIG. 2 is a cross section of the FIG. 1 structure after sectioning.
Figure 3:
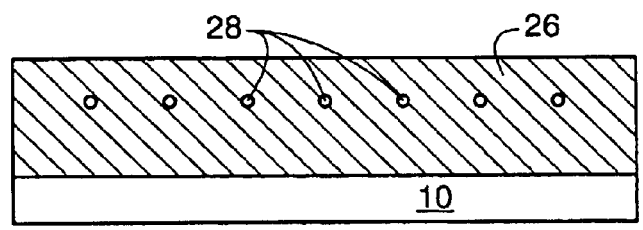
FIG. 3 is a cross section depicting an end view along I—I of the FIG. 2 structure.

Next, the structure of FIG. 1 is sectioned to sever the interconnects which results in the structure depicted in FIGS. 2 and 3 to form electrical contacts. FIG. 3 depicts the FIG. 2 structure along I—I. Sectioning of the FIG. 1 structure can performed by cutting the structure, including the wafer section, the interconnects, and the dielectric, with a wafer saw, by chemical or mechanical etching, by using a water jet, or any other workable means. Alternately, one or more of the wafer section, the interconnects, and the dielectric can be sectioned separately.

During sectioning of the dielectric 26, the interconnects 18, and the wafer section 10, a portion of each interconnect 18 is exposed as depicted in FIG. 3 which depicts ends 28 of several interconnects 18, each of which is connected within the dielectric 26 to a bond pad 16. FIG. 2 depicts a planar face 30 of the dielectric 26 intersecting the wafer section 10 at a right angle, although it is conceivable that the FIG. 1 structure can be sectioned at other angles depending on the eventual use of the device.

Figure 4:
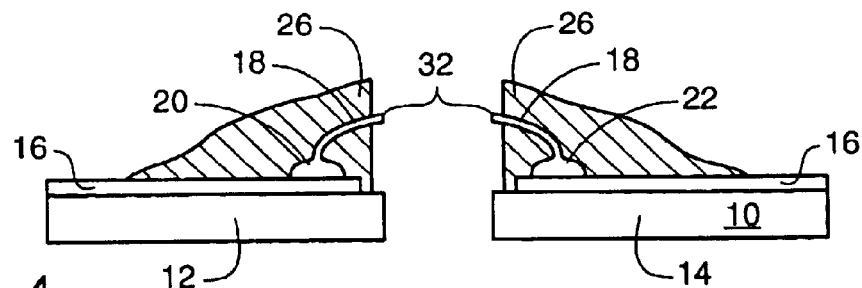
FIG. 4 is a cross section of another embodiment depicting protruding interconnections.

The severed interconnects can be flush with the dielectric as depicted in FIGS. 2 and 3, or the dielectric can be over etched away from the interconnects to provide protruding electrical interconnects which may facilitate connection therewith. Protruding interconnects 32 are depicted in FIG. 4. The ends 32 can be heated to form more rounded contacts, or they can be otherwise formed into a desired shape to facilitate electrical interconnection therewith. If flush as depicted in FIG. 2, the interconnect 18 has a generally planar surface and is generally coplanar with a generally planar surface of the dielectric as depicted in FIG. 2.

If chemical etching is used to section the assembly, a different etchant can be used to section the dielectric, the interconnects, and the wafer section. For example, the wafer, and possibly the dielectric depending the material used, can be etched with a solution of potassium hydroxide and water at 80° C. If a polyimide is used as the dielectric, hydrazine or an oxygen plasma can be used to etch the polyimide.

Connection to the exposed ends can then be made directly with any available means, for example using solder, z-axis conductive films or epoxies, wire bonds, flip-chip connections or mechanical touch contacts.

Figure 5:
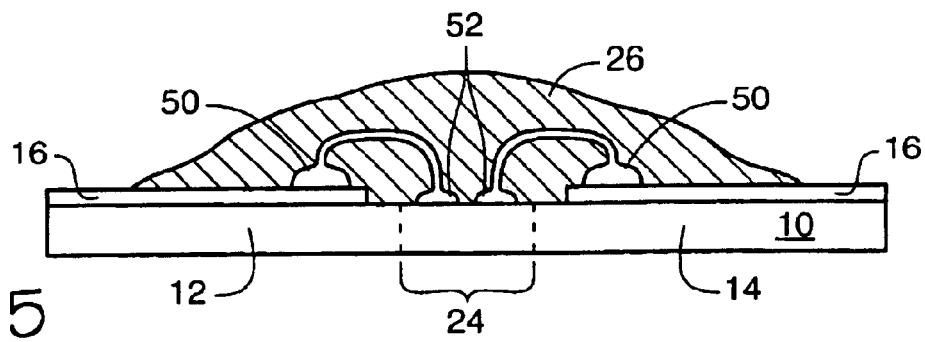
FIG. 5 is a cross section depicting a second embodiment of an in-process structure having a pair of bond wires bonded to a kerf area of a wafer section.
Figure 6:
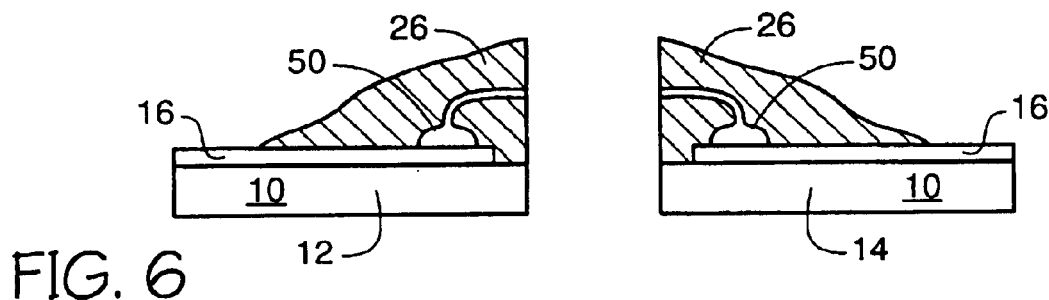
FIG. 6 is a cross section of the FIG. 5 structure after sectioning.

FIG. 5 depicts another embodiment of the invention before sectioning. In this embodiment a first end of each bond wire 50 is connected with a bond pad 16 of one of the unsingularized die 12, 14, and a second end 52 of each bond wire is connected to the street area of the wafer section. The FIG. 5 embodiment depicts two adjacent wire bonds in the street area 24, although a narrower street and thus more die on each wafer can be manufactured if the wire bonds are offset and aligned down the middle of the saw kerf. Thus the space required for the kerf 24 would be determined by the width required by the wafer saw or by the area required to chemically or mechanically etch the assembly during sectioning. With the structure of FIG. 5, the bond pads 16 can be manufactured further from the kerf area to allow for a bond wire with sufficient length for loop control. FIG. 6 depicts the resulting halves of the FIG. 5 structure after sectioning.

Figure 7:
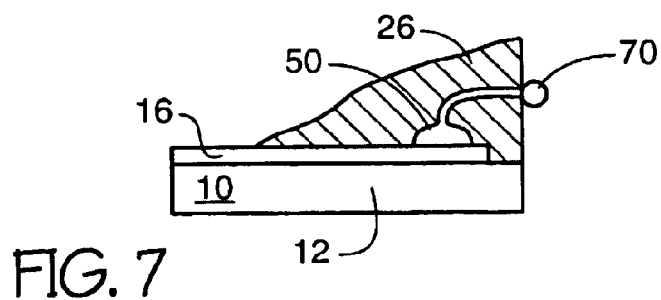
FIG. 7 is a cross section of an embodiment comprising the use of a solder ball to increase the interconnect surface area.

FIG. 7 depicts a sectioned structure after the addition of a solder ball 70 that can be used to increase or improve the contact area to the severed bond wire. The solder ball can comprise a gold-tin alloy, a tin-lead alloy, or an alloy of tin-lead-gold. The solder ball can be preformed by a manner similar to that used during the assembly of fine ball grid arrays (FBGA's) or the solder ball can be plated to the exposed ends of the bond wires.

Figure 8:
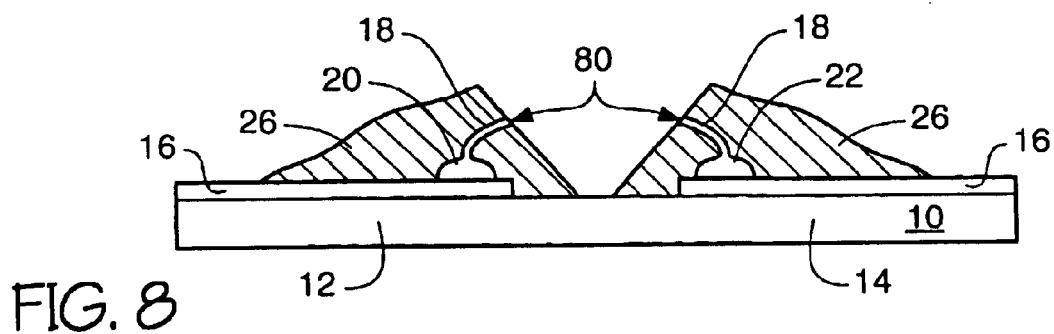
FIG. 8 is a cross section depicting the FIG. 1 embodiment with an angled cut of the dielectric which increases the exposed interconnect surface area.

FIG. 8 depicts an assembly having the dielectric 26 and interconnect 18 sectioned at an angle which increases the surface area of the exposed ends 80 of the interconnect which aids connection therewith. Forming an angled face in the dielectric for connection with a printed circuit board can also be advantageous depending on the eventual use of the die. Angling the dielectric and the cut of the interconnect can be accomplished by first using an angled blade to section the dielectric and the interconnects and to form a bevel in the dielectric and on the interconnects. A different blade such as a conventional wafer saw can then be used to slice and singularize the wafer sections. Alternately, a single blade may be machinable which can section the dielectric and the interconnect on an angle and slice the wafer section vertically with a single pass of the saw.

In another embodiment, the dielectric 26 and the exposed ends of the interconnects can be coated with a conductive material to increase the size of the area to which electrical contact can be made. For example, the dielectric and exposed portions of the interconnects can be sputtered with metal, masked, and etched to form pads which contact the interconnects. Further, a conductive epoxy or paste can be formed on the dielectric and on the exposed ends of the interconnect by means including screen printing, stenciling, or other means known in the art to increase the surface area to which contact can be made.

A semiconductor device comprising the invention could conceivably be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used to form a semiconductor device comprising:
   providing a semiconductor wafer section comprising:
      at least a first semiconductor die and a second semiconductor die;
      at least one conductive pad on each of the first and second dice;
      a kerf area interposed between the first and second dice;
   providing a bond wire having first and second ends;
   attaching the first end of the bond wire to the conductive pad of the first die;
   attaching the second end of the bond wire to only one of the conductive pad of the second die and the kerf area;
   dicing in the kerf area to separate the first die from the second die; and
   during the dicing in the kerf area, cutting the bond wire.

2. The method of claim 1 wherein the bond wire is a first bond wire and the method further comprises:
   attaching the second end of the first bond wire to the kerf area of the wafer section;
   providing a second bond wire having first and second ends;
   connecting the first end of the second bond wire to the conductive pad of the second semiconductor die;
   connecting the second end of the second bond wire to the kerf of the semiconductor wafer section; and
   during the dicing in the kerf area, cutting the second bond wire.

3. The method of claim 2 further comprising, subsequent to connecting the first end of the first bond wire with the conductive pad of the first die, and subsequent to connecting the first end of the second bond wire with the conductive pad of the second die, and subsequent to connecting the second ends of the first and second bond wire with the kerf area:
   encapsulating the first and second bond wires, the conductive pads of the first and second semiconductor dice, and at least a portion of a major surface of the wafer section with an encapsulation material; and
   during the dicing in the kerf area, segmenting the encapsulation material into first and second segments, wherein the first segment comprises the first semiconductor die and a portion of the first bond wire and the second segment comprises the second semiconductor die and a portion of the second bond wire.

4. A method used to form a semiconductor device, comprising:
   providing an unsingularized semiconductor wafer section comprising at least a first semiconductor die having at least one bond pad and a second semiconductor die having at least one bond pad, wherein the first and second semiconductor dice are separated from each other by a kerf area;
   attaching a first end of a first bond wire to the bond pad of the first semiconductor wafer section and attaching a second end of the first bond wire to the kerf area;
   attaching a first end of a second bond wire to the bond pad of the second semiconductor wafer section and attaching a second end of the second bond wire to the kerf area;
   providing an encapsulation material over a major surface of the unsingularized wafer section to encapsulate the first and second bond wires;
   subsequent to attaching the first and second bond wires, segmenting the first semiconductor wafer section from the second semiconductor wafer section; and
   during the segmenting of the first semiconductor wafer section from the second semiconductor wafer section, exposing the first bond wire at a first surface of the encapsulation material and exposing the second bond wire at a second surface of the encapsulation material.

5. The method of claim 4 further comprising segmenting the first semiconductor wafer section from the second semiconductor wafer section using a saw which removes at least a portion of the kerf area, the first and second bond wires, and the encapsulation material.

6. The method of claim 4 further comprising segmenting the first semiconductor wafer section from the second semiconductor wafer section using an etching process which removes at least a portion of the kerf area, the first and second bond wires, and the encapsulation material.

7. The method of claim 4 further comprising, subsequent to exposing the first bond wire at the first surface of the encapsulation material and exposing the second bond wire at the second surface of the encapsulation material, removing a portion of the encapsulation material at the first and second surfaces to result in a protrusion of the first and second bond wires from the first and second surfaces of the encapsulation material.

8. The method of claim 7 further comprising heating the protruding first and second bond wires to form a rounded contact from each of the first and second bond wires.

9. The method of claim 4 further comprising providing the encapsulation material over only one surface of the unsingularized wafer section.

10. A method used to form a semiconductor device, comprising:
   providing an unsingularized semiconductor wafer section comprising at least a first semiconductor die having a first bond pad and a second semiconductor die having a second bond pad, wherein the first and second semiconductor dice are separated from each other by a kerf area;

attaching a first end of a bond wire to the first bond pad and attaching a second end of the bond wire to the second bond pad such that the bond wire overlies the kerf area; and subsequent to attaching the bond wire to the first and second bond pads, segmenting the first semiconductor wafer section from the second semiconductor wafer section; and during the segmenting of the first semiconductor wafer section from the second semiconductor wafer section, removing at least a portion of the kerf area and the bond wire.

11. The method of claim 10 further comprising providing an encapsulation material over a major surface of the unsingularized wafer section to encapsulate the bond wire.

12. The method of claim 11 further comprising removing at least a portion of the encapsulation material during the segmenting of the first semiconductor wafer section from the second semiconductor wafer section.

13. The method of claim 11 further comprising segmenting the first semiconductor wafer section from the second semiconductor wafer section using an etching process which removes at least a portion of the kerf area, the bond wire, and the encapsulation material.

14. The method of claim 11 further comprising exposing the bond wire at a first exposed surface of the encapsulation material which is connected to the first semiconductor wafer section and exposing the bond wire at a second exposed surface of the encapsulation material which is connected to the second semiconductor wafer section during the segmenting of the first semiconductor wafer section from the second semiconductor wafer section.

15. The method of claim 14 further comprising, subsequent to exposing the bond wire at the first and second surfaces of the encapsulation material, removing a portion of the encapsulation material at the first surface to result in a protrusion of the bond wire from the first surface of the encapsulation material.

16. The method of claim 15 further comprising heating the protruding bond wire to form a rounded contact from the bond wire.

17. The method of claim 11 further comprising providing the encapsulation material over only one surface of the unsingularized wafer section.

18. A method used to form a semiconductor device, comprising:

providing an unsingularized semiconductor wafer section comprising at least a first semiconductor die having at least one bond pad and a second semiconductor die having at least one bond pad, wherein the first and second semiconductor dice are separated from each other by a kerf area;

attaching a first end of a bond wire to the bond pad of the first semiconductor die;

subsequent to attaching the first end of the bond wire to the bond pad of the first semiconductor die, removing a portion of the kerf area to separate the first semiconductor die from the second semiconductor die; and during the separation of the first semiconductor die from the second semiconductor die, removing a portion of the bond wire.

19. The method of claim 18 further comprising removing the portion of the kerf area and the portion of a bond wire with a dicing saw.

20. The method of claim 18 further comprising attaching a second end of the bond wire to the bond pad of the second semiconductor die prior to removing the portion of the bond wire.

21. The method of claim 18 where the bond wire is a first bond wire and the method further comprises:

attaching a second end of the first bond wire to the kerf area of the unsingularized semiconductor wafer section;

attaching a first end of a second bond wire to the bond pad of the second semiconductor die and attaching a second end of the second bond wire to the kerf area of the unsingularized semiconductor wafer section; and while removing the portion of the kerf area, removing a portion of the second bond wire.

* * * * *